US012689359B2

(12) United States Patent
Hartin et al.

(10) Patent No.: US 12,689,359 B2
(45) Date of Patent: Jul. 21, 2026

(54) TIME DELAY CALIBRATOR AND METHOD

(71) Applicant: Raytheon Company, Tewksbury, MA (US)

(72) Inventors: Paul T. Hartin, McKinney, TX (US); Richard Godley, McKinney, TX (US); Jacob A. Hanson-Daisa, Celina, TX (US)

(73) Assignee: Raytheon Company, Arlington, VA (US)

( * ) Notice: Subject to any disclaimer, the term of this patent is extended or adjusted under 35 U.S.C. 154(b) by 175 days.

(21) Appl. No.: 18/804,674

(22) Filed: Aug. 14, 2024

(65) Prior Publication Data

US 2026/0051880 A1     Feb. 19, 2026

(51) Int. Cl.
*H03K 5/01*     (2006.01)
*H03F 3/19*     (2006.01)
*H03K 5/00*     (2006.01)

(52) U.S. Cl.
CPC .............. *H03K 5/01* (2013.01); *H03F 3/19* (2013.01); *H03F 2200/294* (2013.01); *H03K 2005/00019* (2013.01)

(58) Field of Classification Search
CPC .. H03K 5/01; H03K 2005/00019; H03F 3/19; H03F 2200/294
USPC ........................................... 327/261
See application file for complete search history.

(56) References Cited

U.S. PATENT DOCUMENTS

| | | | | |
|---|---|---|---|---|
| 8,934,587 B2 * | 1/2015 | Weber | ................... | G01S 7/2813 |
| | | | | 375/348 |
| 10,218,490 B1 * | 2/2019 | Yang | ..................... | H04L 5/1461 |
| 2001/0012770 A1 * | 8/2001 | Pol | ......................... | H04B 17/21 |
| | | | | 455/245.2 |
| 2004/0056210 A1 * | 3/2004 | Scherer | ................... | G04F 10/10 |
| | | | | 250/492.1 |
| 2007/0207759 A1 * | 9/2007 | Vavelidis | ............... | H04B 17/21 |
| | | | | 455/232.1 |
| 2024/0162910 A1 * | 5/2024 | Urban | ................. | H03M 1/0604 |
| 2025/0105796 A1 * | 3/2025 | Achiriloaie | ............... | H03F 3/21 |

FOREIGN PATENT DOCUMENTS

| | | |
|---|---|---|
| KR | 10-2022-0015627 A | 2/2022 |
| WO | 2018057122 A1 | 3/2018 |

OTHER PUBLICATIONS

International Search Report and Written Opinion of the International Searching Authority dated Nov. 25, 2025, in connection with International Application No. PCT/US2025/041149, 11 pages.

* cited by examiner

*Primary Examiner* — Ryan Jager

(57)     ABSTRACT

A method includes generating a shaped gate signal using a gate voltage generator and providing the shaped gate signal to a gate of an active component of a radio frequency (RF) chain in a time delay-based array. The method also includes amplifying noise with a changing gain based on the shaped gate signal using the active component and generating shaped noise data based on the amplified noise using the RF chain. The method further includes measuring a path length for the RF chain based on an arrival time for the shaped noise data and calculating a time delay for the RF chain based on the path length to calibrate the array.

20 Claims, 8 Drawing Sheets

100

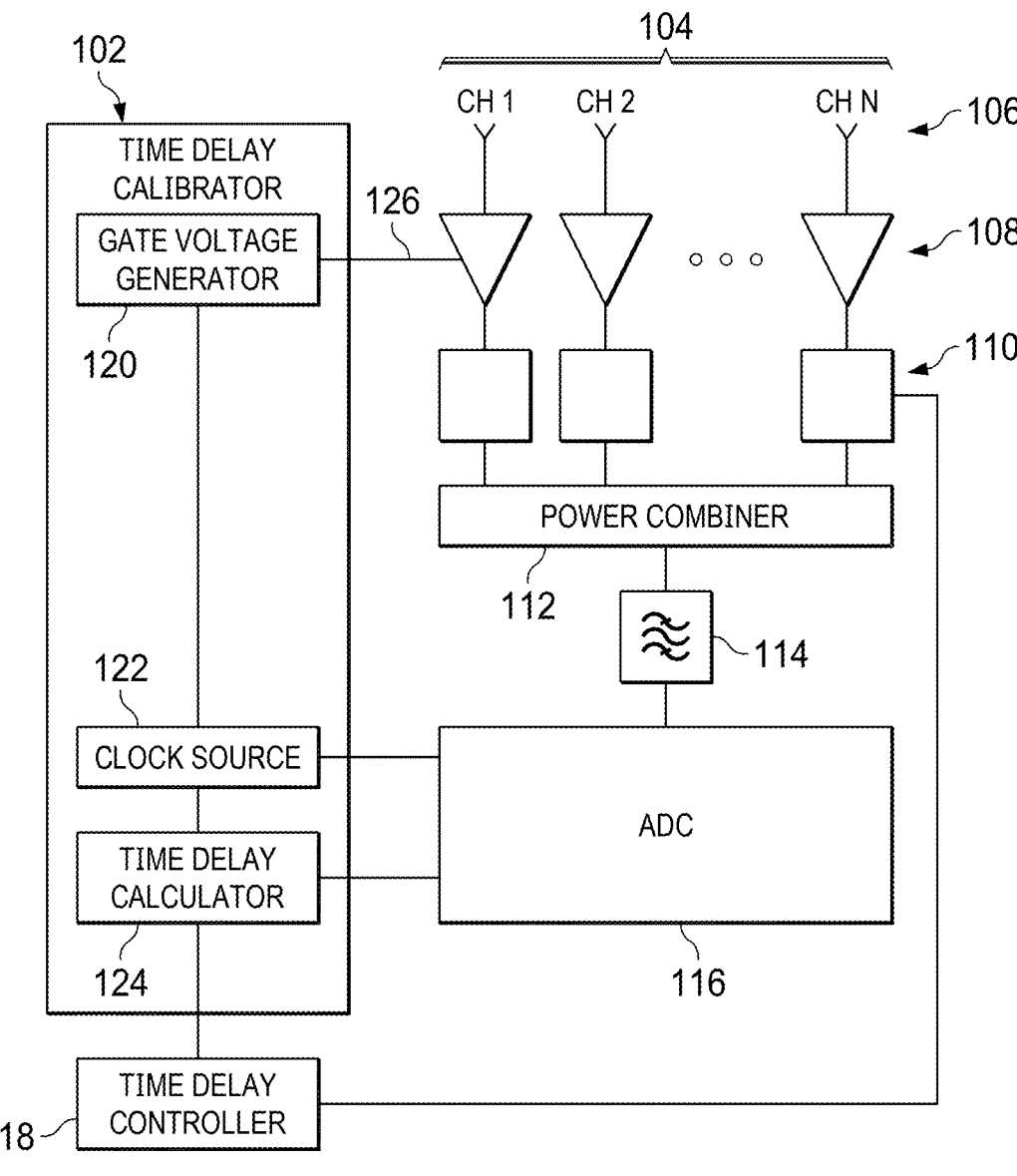
FIG. 1

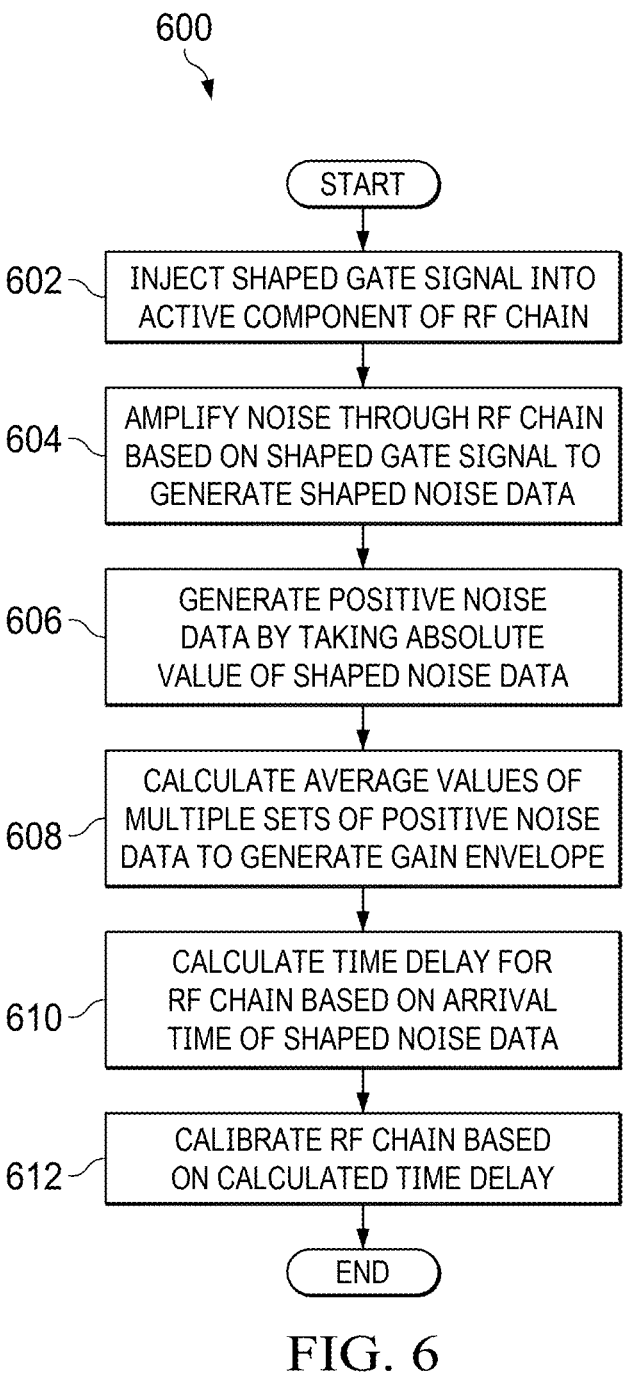

600

START

602 — INJECT SHAPED GATE SIGNAL INTO ACTIVE COMPONENT OF RF CHAIN

604 — AMPLIFY NOISE THROUGH RF CHAIN BASED ON SHAPED GATE SIGNAL TO GENERATE SHAPED NOISE DATA

606 — GENERATE POSITIVE NOISE DATA BY TAKING ABSOLUTE VALUE OF SHAPED NOISE DATA

608 — CALCULATE AVERAGE VALUES OF MULTIPLE SETS OF POSITIVE NOISE DATA TO GENERATE GAIN ENVELOPE

610 — CALCULATE TIME DELAY FOR RF CHAIN BASED ON ARRIVAL TIME OF SHAPED NOISE DATA

612 — CALIBRATE RF CHAIN BASED ON CALCULATED TIME DELAY

END

START

702 — PERFORM FFT ON THE TD-SHAPED NOISE DATA TO GENERATE FD-SHAPED NOISE DATA

704 — IDENTIFY ANY INTERFERERS IN THE FD-SHAPED NOISE DATA

706 — REMOVE ANY IDENTIFIED INTERFERERS FROM THE FD-SHAPED NOISE DATA TO GENERATE MODIFIED FD-SHAPED NOISE DATA

708 — PERFORM IFFT TO CONVERT THE MODIFIED FD-SHAPED NOISE DATA TO MODIFIED TD-SHAPED NOISE DATA

END

TIME DELAY CALIBRATOR AND METHOD

TECHNICAL FIELD

This disclosure relates generally to calibration for time delay-based arrays. More specifically, this disclosure relates to a time delay calibrator and method.

BACKGROUND

Time delay-based arrays typically require periodic in-situ recalibration to account for aging or environmental changes in radio frequency (RF) path delays that can degrade array time alignment. Traditional in-situ calibration for an array relies on a signal that is injected onto an RF path ahead of the first active component, such as a low-noise amplifier, so that any drift can be measured.

SUMMARY

This disclosure relates to a time delay calibrator and method.

In a first embodiment, a time delay calibrator includes a gate voltage generator configured to be coupled to an active component of a radio frequency (RF) chain in a time delay-based array. The gate voltage generator is configured to generate a shaped gate signal and provide the shaped gate signal to a gate of the active component. The active component is configured to amplify noise with a changing gain based on the shaped gate signal, and the RF chain is configured to generate shaped noise data based on the amplified noise. The time delay calibrator also includes a time delay calculator configured to measure a path length for the RF chain based on an arrival time for the shaped noise data and calculate a time delay for the RF chain based on the path length to calibrate the array.

Any single one or any combination of the following features may be used with the first embodiment. A clock source may be coupled to the gate voltage generator and to an analog-to-digital converter (ADC) for the array. The clock source may be configured to provide a clock signal to the gate voltage generator and the ADC to keep clocking of the gate voltage generator coherent with clocking of the ADC. The active component may include a first active component in the RF chain. The active component may include a low-noise amplifier (LNA). The shaped gate signal may include one of a triangle waveform, a sawtooth waveform, or a square waveform. To calculate the arrival time for the shaped noise data, the time delay calculator may be configured perform a Fast Fourier Transform (FFT) on the shaped noise data from the RF chain to generate frequency domain-shaped noise data, identify and remove interferers from the frequency domain-shaped noise data to generate modified frequency domain-shaped noise data, and perform an inverse FFT on the modified frequency domain-shaped noise data to generate modified time domain-shaped noise data for use in calculating the arrival time. The time delay calculator may be configured to calculate the arrival time for the shaped noise data based on a plurality of sums of samples for a first summing window and a plurality of sums of samples for a second summing window, and each sum of samples may be based on a different location of the corresponding summing window.

In a second embodiment, a time delay-based array includes an RF chain having a plurality of active components including a specified active component. The time delay-based array also includes an ADC coupled to the RF chain and configured to receive shaped noise data generated by the RF chain. The time delay-based array further includes a time delay calibrator including a gate voltage generator and a time delay calculator. The gate voltage generator is coupled to the specified active component of the RF chain. The gate voltage generator is configured to generate a shaped gate signal and provide the shaped gate signal to a gate of the specified active component. The specified active component is configured to amplify noise with a gain based on the shaped gate signal, and the RF chain is configured to generate the shaped noise data based on the amplified noise. The time delay calculator is configured to measure a path length for the RF chain based on an arrival time for the shaped noise data and calculate a time delay for the RF chain based on the path length to calibrate the array.

Any single one or any combination of the following features may be used with the second embodiment. The time delay calibrator may include a clock source coupled to the gate voltage generator and to the ADC. The clock source may be configured to provide a clock signal to the gate voltage generator and the ADC to keep clocking of the gate voltage generator coherent with clocking of the ADC. The specified active component may include a first active component in the RF chain. The specified active component may include an LNA. The shaped gate signal may include one of a triangle waveform, a sawtooth waveform, or a square waveform. To calculate the arrival time for the shaped noise data, the time delay calculator may be configured to perform an FFT on the shaped noise data from the RF chain to generate frequency domain-shaped noise data, identify and remove interferers from the frequency domain-shaped noise data to generate modified frequency domain-shaped noise data, and perform an inverse FFT on the modified frequency domain-shaped noise data to generate modified time domain-shaped noise data for use in calculating the arrival time. The time delay calculator may be configured to calculate the arrival time for the shaped noise data based on a plurality of sums of samples for a first summing window and a plurality of sums of samples for a second summing window, and each sum of samples may be based on a different location of the corresponding summing window.

In a third embodiment, a method includes generating a shaped gate signal using a gate voltage generator and providing the shaped gate signal to a gate of an active component of an RF chain in a time delay-based array. The method also includes amplifying noise with a changing gain based on the shaped gate signal using the active component and generating shaped noise data based on the amplified noise using the RF chain. The method further includes measuring a path length for the RF chain based on an arrival time for the shaped noise data and calculating a time delay for the RF chain based on the path length to calibrate the array.

Any single one or any combination of the following features may be used with the third embodiment. The method may include providing a clock signal to the gate voltage generator and an ADC for the array to keep clocking of the gate voltage generator coherent with clocking of the ADC. The active component may include a first active component in the RF chain. The active component may include an LNA. The shaped gate signal may include one of a triangle waveform, a sawtooth waveform, or a square waveform. Calculating the arrival time for the shaped noise data may include performing an FFT on the shaped noise data from the RF chain to generate frequency domain-shaped noise data, identifying and removing interferers from the frequency domain-shaped noise data to generate modified frequency domain-shaped noise data, and performing an inverse FFT on the modified frequency domain-shaped noise data to generate modified time domain-shaped noise data for use in calculating the arrival time. Calculating the time delay for the RF chain may include calculating the arrival time for the shaped noise data based on a plurality of sums of samples for a first summing window and a plurality of sums of samples for a second summing window, and each sum of samples may be based on a different location of the corresponding summing window.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which:

FIG. 1 illustrates an example of a time delay-based array including a time delay calibrator according to this disclosure;

FIG. 6 illustrates an example of a method for providing time delay calibration according to this disclosure;

DETAILED DESCRIPTION

Figure 2:
FIG. 2 illustrates a set of graphs depicting examples of the generation of data for use in the time delay calibrator of FIG. 1 according to this disclosure.

FIGS. 1 through 8, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, time delay-based arrays typically require periodic in-situ recalibration to account for aging or environmental changes in radio frequency (RF) path delays that can degrade array time alignment. Traditional in-situ calibration for an array relies on a signal that is injected onto an RF path ahead of the first active component, such as a low-noise amplifier (LNA), so that any drift can be measured.

Implementation of this type of solution often includes the addition of components that have high size, weight, power, and cost (SWaP-C) requirements. For example, if an array has thousands of channels, getting an RF feed split out to thousands of elements can suffer from very high SWaP-C.

Moreover, some systems may not be able to implement standard solutions such as this due to the need for a coupler that increases noise to unacceptable levels, no availability of transmit channels for creating a calibration signal, system requirements that prohibit injection of a calibration signal prior to the first active component, or the like. For example, because a signal may be injected before the first active component in an RF chain, any loss ahead of that component can have increased noise, resulting in the coupler having some loss. This loss degrades performance, especially for wideband couplers. Another issue with using traditional in-situ calibration arises for receive-only arrays, which have no transmit channels for use in calibration. For these arrays, additional hardware needs to be included to create a transmit path for the calibration process.

Finally, for some applications, radiation cannot be allowed backwards up the path. For these applications, a calibration signal cannot be injected ahead of the first active component because RF waves can radiate in both directions, including back up the path. Thus, a coupler cannot be located before the first active component. To account for this, traditional in-situ calibration methods include locating the coupler further down the chain. However, with this solution, the first active component is no longer in the loop, which degrades phase/time alignment.

This disclosure provides various techniques for achieving in-situ calibration without the limitations of traditional techniques. For example, the gain of an RF path can be adjusted over time in such a way that the time delay from the first active component to an analog-to-digital converter (ADC) can be measured based on input noise without the injection of a signal into the RF path. Because the gain of an LNA can vary as a function of its gate voltage, injecting a low frequency-shaped signal on top of the gate voltage can cause the noise gain of the LNA to have a similar shape in the time domain. The ADC can sample the noise at a particular frequency over the time period of the injected signal. The calculated time of arrival can be compared to a value determined at factory calibration to determine drift error for correction. As a result, in-situ calibration may be provided (i) without the need for injecting a signal onto an RF path ahead of the first active component and (ii) without the additional high SWAP-C components required by that technique. In addition, receive-only arrays can implement these techniques without the need to include hardware to create a transmit path.

FIG. 1 illustrates an example of a time delay-based array 100 including a time delay calibrator 102 according to this disclosure. The embodiment of the time delay calibrator 102 shown in FIG. 1 is for illustration only. Other embodiments of the time delay calibrator 102 may be used without departing from the scope of this disclosure.

According to embodiments of this disclosure, in addition to the time delay calibrator 102, the array 100 can include a plurality of channels 104, each of which can include a corresponding input 106 (such as a radiator or other suitable input), an LNA 108, and a time delay block 110. In addition to the LNA 108, each channel 104 may also include one or more additional amplifiers. For example, after the LNA 108 for a particular channel 104, four, five, six, or any suitable number of additional amplifiers can be included in an RF chain for that particular channel 104. In some embodiments, each of the LNAs 108 may be a depletion-mode amplifier or other suitable amplifier, which can be adjusted to provide a specified gain based on a gate voltage for the LNA 108. As a particular example, when a drain voltage for one of the LNAs 108 is at 6.5V, that LNA 108 may provide no gain when its gate voltage is-2.5V and 17 dB of gain when its gate voltage is-2.2V. As a result, adjustments to the gate voltages of the LNAs 108 may be used to throttle the gains of those LNAs 108 either up or down.

The array 100 can also include a power combiner 112, one or more additional signal filtering components 114, one or more ADCs 116, and a time delay controller 118. The power combiner 112 can be configured to combine the signals from the channels 104 to generate a combined signal and to provide the combined signal to the additional signal filtering component(s) 114. The additional signal filtering component(s) 114 can be configured to provide any suitable additional signal filtering on the combined signal received from the power combiner 112 in order to generate a filtered signal and to provide the filtered signal to the ADC 116. The ADC 116 can be configured to convert the filtered signal from an analog signal into a digital signal for any suitable digital processing.

Each of the channels 104 can provide a separate RF path for the array 100. During production, the channels 104 can be aligned in time or phase with each other through a factory calibration process. For example, a signal can be sent through each of the channels 104 in the factory, and the path length from each of the inputs 106 to the ADC 116 can be measured. The time delay controller 118, which is coupled to the time delay blocks 110, can individually tune each of the time delay blocks 110 such that the path length for each channel 104 is substantially the same as the other channels 104. For example, in some embodiments, the time delay blocks 110 can include copper traces of differing lengths, and the time delay controller 118 can be configured to switch in the copper trace of a time delay block 110 having a length corresponding to the desired delay for that time delay block 110.

Thus, in operation, based on signals from the time delay controller 118, each time delay block 110 can introduce a specified time delay specific to the corresponding channel 104 such that the path lengths for the channels 104 are substantially the same. Any actual variances among the path lengths can be configured such that times to transit the paths are kept within a predetermined range of times based on the particular application in which the array 100 is implemented. For specific embodiments, the path lengths may be considered to be calibrated when the transit times for signals in the paths are within about 15 ps, 10 ps, 5 ps, or other suitable amount of time.

Over time and with changing temperature, the gain/phase/time delay within the array 100 may change. For example, thermal expansion can cause metal to expand with heat, which results in longer distances for electrons to propagate and thus longer time delays. Similarly, decreases in temperature can cause metal to contract, resulting in smaller time delays. To account for these possible changes, the time delay calibrator 102 can be configured to monitor the path lengths for changes. When the time delay calibrator 102 determines that a path length for a particular channel 104 has changed for any reason, the time delay calibrator 102 can be configured to determine an updated time delay for that particular channel 104 to ensure its path length provides a time delay within the predetermined range of times, thereby keeping the channels 104 of the array 100 calibrated.

The time delay calibrator 102 is coupled to the LNAs 108, the ADC 116, and the time delay controller 118. The time delay calibrator 102 can include a gate voltage generator 120, a clock source 122, and a time delay calculator 124. The gate voltage generator 120 is coupled to the LNAs 108 and the clock source 122. The gate voltage generator 120 may be configured to generate changing gate voltages in the form of a shaped gate signal 126 for the LNAs 108 in order to modify the gains of the LNAs 108 over time. A "shaped gate signal" refers to a gate signal having a changing voltage level that corresponds to a specified waveform shape (as opposed to a gate signal having a voltage level that remains substantially the same). Thus, as described in more detail below, during in-situ calibration, the gate voltage generator 120 may be configured to inject the shaped gate signal 126 on top of the gate voltages used during normal operation. For example, the gate voltage generator 120 may be configured to inject a shaped gate signal 126 having a triangle waveform, a sawtooth waveform, a square waveform, or any other suitable shape. As a result, the gate voltages applied to the gates of the LNAs 108 can be changed along with the shape of the shaped gate signal 126. In some embodiments, the gate voltage generator 120 may include a digital-to-analog converter (DAC), a wave generator circuit, or any other suitable component configured to generate a shaped gate signal 126.

In addition to the gate voltage generator 120, the clock source 122 is coupled to the ADC 116 and the time delay calculator 124. The clock source 122 may be configured to provide deterministic time alignment between when the clock signal is provided to the gate voltage generator 120 and when the clock signal is provided to the ADC 116 in order to keep the clocking of the gate voltage generator 120 coherent with the clocking of the ADC 116. The shaped gate signal 126 generated by the gate voltage generator 120 is applied to the LNAs 108 when the ADC 116 clocks because the phase of the shaped gate signal 126 is observed relative to the clock on the ADC 116. Thus, the clock source 122 is configured to keep these coherent with each other. The clock source 122 may also be configured to provide the clock signal to the time delay calculator 124.

In addition to the gate voltage generator 120 and the clock source 122, the time delay calculator 124 is coupled to the ADC 116 and the time delay controller 118. For each channel 104, based on the coherent clock signal provided by the clock source 122, the time delay calculator 124 may be configured to measure how much time passes while a gain pulse generated by each LNA 108 as a result of the changing gate voltage in the shaped gate signal 126 travels through the path from the LNA 108 for that channel 104 to the ADC 116. Based on the measured path lengths, the time delay calculator 124 may individually calculate an appropriate time delay for each channel 104 such that the path lengths remain calibrated with each other. The time delay calculator 124 may also be configured to provide the calculated time delays for each channel 104 to the time delay controller 118, which can be configured to make any necessary adjustments to the time delays introduced by the time delay blocks 110 as described above based on the calculated time delays in order to keep the path lengths of the channels 104 calibrated. In some embodiments, the time delay calculator 124 may be configured to receive a signal from the gate voltage generator 120 when the shaped gate signal 126 is provided to the gate of the LNA 108 in order to determine the time at which the shaped gate signal 126 was sent.

In operation, the channels 104 can be factory calibrated, resulting in the time delay blocks 110 providing specified time delays for their corresponding channels 104 in order to calibrate path lengths of the channels 104 with each other. During in-situ use, in some embodiments, as the array 100 is exposed to changing temperatures and other issues, the gate voltage generator 120 generates a shaped gate signal 126 to provide a changing gate voltage to each of the LNAs 108, which results in a corresponding changing gain provided by each of the LNAs 108. The time delay calculator 124 measures the amount of time for the resulting gain pulse to travel through each path from one of the LNAs 108 back down to the ADC 116. The time delay calculator 124 calculates a time delay for each channel 104 based on the measured time for the gate pulse and provides the updated time delay to the time delay controller 118. In some embodiments, if any calculated time delay is different from the current time delay introduced by the associated time delay block 110, the time delay controller 118 modifies that time delay. In other embodiments, the time delay controller 118 may send the calculated time delays to the time delay blocks 110 regardless of whether the time delays have changed. The time delay blocks 110 introduce the appropriate time delays based on signals from the time delay controller 118, thereby keeping the channels 104 calibrated with each other.

In this way, a gate voltage injection can be used to create noise gain that is coherent to a waveform. During normal operation, a stable unchanging gate voltage may be desired for the LNAs 108. However, providing changing gate voltages allows the time delay calibrator 102 to perform an in-situ calibration by using the gate voltage-gain dependence of the LNAs 108. This allows time delay calibration to be accomplished using a low frequency waveform for use at a much higher RF frequency. As a result, the time delay calibrator 102 can be configured to measure RF path delays using only noise through the RF chain and using amplitude instead of phase.

Although FIG. 1 illustrates one example of a time delay-based array 100 including a time delay calibrator 102, various changes may be made to FIG. 1. For instance, the time delay-based array 100 and the time delay calibrator 102 may each include additional components not shown in FIG. 1. Also, the clock source 122 may be implemented separately from the time delay calibrator 102 while still being coupled to the gate voltage generator 120. Further, it will be understood that a similar process can be implemented for a transmit path (not shown in FIG. 1) by measuring a path length from a DAC (also not shown in FIG. 1) back to the inputs 106. In addition, note that the view shown in FIG. 1 is not to scale.

FIG. 2 illustrates a set of graphs 200 depicting examples of the generation of data for use in the time delay calibrator 102 according to this disclosure. The graphs 200 shown in FIG. 2 are for illustration only. Other data may be used by the time delay calibrator 102 without departing from the scope of this disclosure.

The graphs 200 include a shaped gate signal 126, which can include data corresponding to an example of the gate voltages generated by the gate voltage generator 120 and output to the gates of the LNAs 108. Thus, for this particular example, the shaped gate signal 126 has a triangle waveform. For the illustrated embodiment, the gate voltages provided through the shaped gate signal 126 vary from fully pinched off (no drain current) to full gain at a 500 kHz rate. It will be understood that the gate voltages provided through the shaped gate signal 126 may vary at any suitable rate and, as described above, may include any suitable shape.

The graphs 200 also include shaped noise data 202, which can include data corresponding to an example of noise data that may be received at the ADC 116 based on the gate voltages provided through the shaped gate signal 126. The shaped noise data 202 includes the combined noise gain from the amplifiers, including the LNA 108, in a particular one of the channels 104. Thus, each amplifier in a channel 104 amplifies any noise present in that channel 104 of the array 100. For example, the noise may include thermal noise. The peak-to-peak amplitude of the shaped noise data 202 illustrates the gain variation, and the shaped noise data 202 includes frequency content of the passband of the RF chain for the channel 104 or the ADC 116.

The amplitude of the shaped noise data 202 shows how the gain changes based on the adjustments to the gate voltage provided by the gate voltage generator 120 as shown in the shaped gate signal 126. Thus, as the gate voltage increases due to the rise in the shaped gate signal 126, the gain goes up at the LNAs 108, which results in the noise that reaches the ADC 116 also increasing. Similarly, as the gate voltage decreases due to the decline in the shaped gate signal 126, the gain goes down at the LNAs 108, which results in the noise that reaches the ADC 116 also decreasing.

The ADC 116 can be configured to provide the shaped noise data 202 to the time delay calculator 124. Because the shaped noise data 202 is generated based on amplified noise, this data 202 includes both positive and negative voltages. Thus, the time delay calculator 124 can be configured to calculate the absolute values of the shaped noise data 202 that is provided by the ADC 116 in order to generate positive noise data 204.

The time delay calculator 124 can also be configured to calculate the average of the shaped noise data 202 values over time, meaning the median value of the noise, based on the positive noise data 204 previously calculated by the time delay calculator 124 as shown in the graph 200. For example, the time delay calculator 124 can be configured to calculate the average of the positive noise data 204 by finding the average of positive noise data 204 over a specified number of cycles. In this way, the time delay calculator 124 can generate the gain envelope 206. For the illustrated embodiment in which the shaped gate signal 126 includes a triangle shape, the shape of the shaped gate signal 126 keeps the gain envelope 206 monotonic and substantially linear.

Although FIG. 2 illustrates one example of a set of graphs 200 depicting an example of the generation of data for use in the time delay calibrator 102 according to this disclosure, various changes may be made to FIG. 2. For instance, the data included in this example is specific to one particular calibration for one particular channel 104 using one particular example of noise data. However, it will be understood that the data can be based on different gate voltages, including shaped gate signals 126 having different shapes, and is based on the actual noise present while calibration is being performed for each channel 104.

Figure 3:
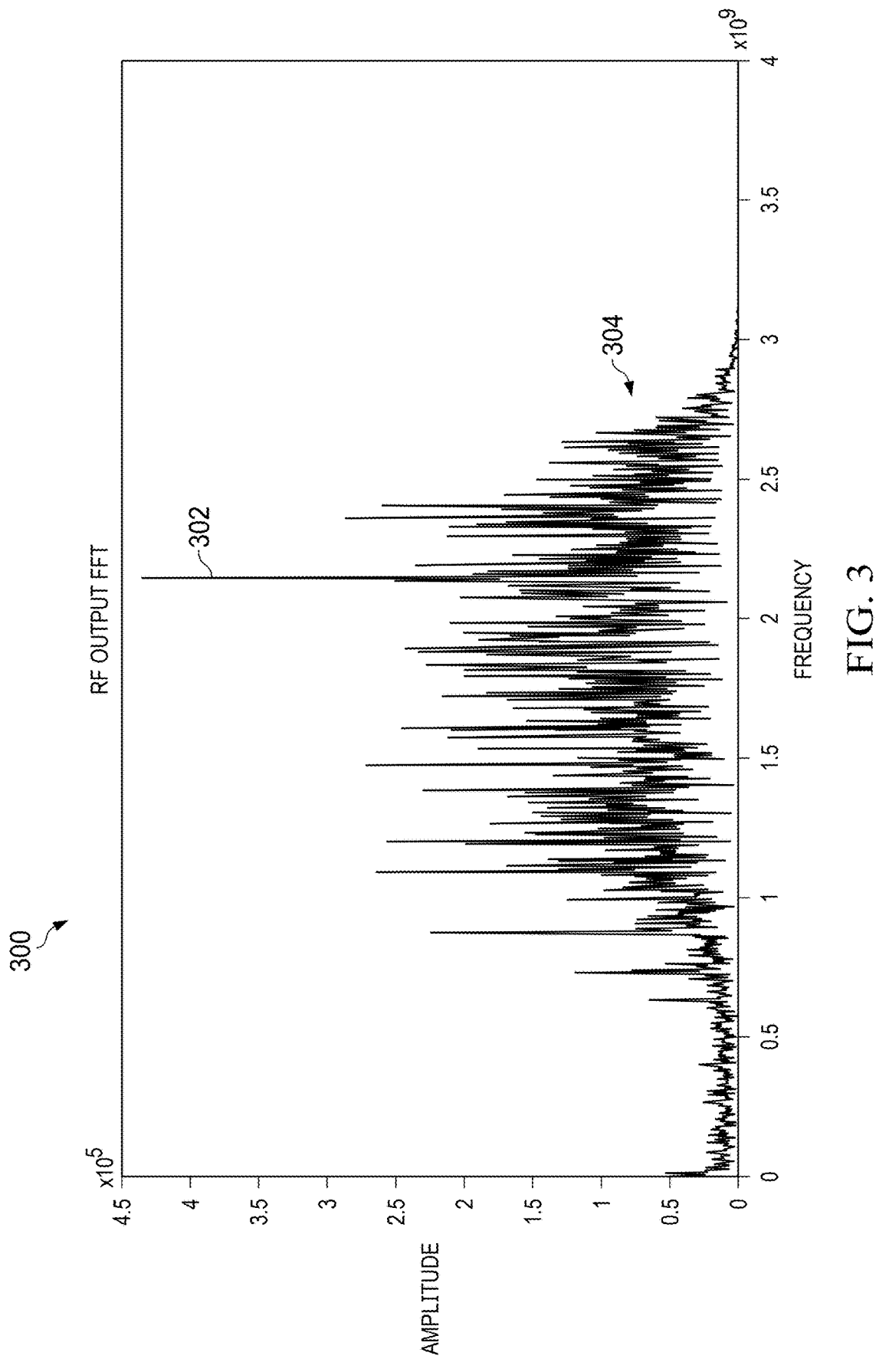
FIG. 3 illustrates a graph of an example of radio frequency (RF) noise in the frequency domain, including an interferer, for use in time delay calibration according to this disclosure.

FIG. 3 illustrates a graph 300 of an example of RF noise in the frequency domain, including an interferer 302, for use in time delay calibration according to this disclosure. The graph 300 shown in FIG. 3 is for illustration only. Other RF noise in the frequency domain may be used by the time delay calibrator 102 without departing from the scope of this disclosure.

Because thermal noise generally has a low power level, shaped noise data 202 such as that shown in the graphs 200 is subject to interference. As a result, the time delay calculator 124 can be configured to remove interference that may dominate the results of its calculations. For example, the interferer 302 shown in the graph 300 may be a signal from a nearby cell phone base station, a harmonic, or the result of any other large interference generator. Thus, the time delay calculator 124 can provide a more accurate time delay calculation by removing the interferer 302. Although illustrated with only one interferer 302, it will be understood that the data may include multiple interferers 302 or no interferers 302.

In some embodiments, the time delay calculator 124 can be configured to perform a Fast Fourier Transform (FFT) on the time domain-shaped noise data 202 to generate frequency domain-shaped noise data 304, such as the data shown in the graph 300. The time delay calculator 124 can also be configured to find the average of the frequency domain-shaped noise data 304. Based on a predetermined tolerance limit, the time delay calculator 124 can be configured to remove any noise data that is above the tolerance limit, which can be assumed to be an interferer, such as the interferer 302. In some embodiments, the tolerance limit may be a specified amount above the average value. For example, the specified amount may be about 2 dB, 5 dB, or any other suitable amount based on the specific application in which the array 100 is implemented. After subtracting any data higher than the tolerance limit, the time delay calculator 124 can be configured to convert the modified frequency domain-shaped noise data 304 back into the time domain, such as by using an inverse FFT, and take the absolute value of the converted data to generate shaped noise data 202 with any interferers 302 removed. In this way, the time delay calculator 124 can generate modified time domain-shaped noise data 202 that more accurately reflects the path length for the shaped gate signals 126 traveling through the channels 104.

In addition, variations in the time delays of the channels 104 over different frequencies are a possibility. Thus, for an array 100 that may operate over a frequency range like 2 GHz to 10 GHz, for example, the time delay calculator 124 can be configured in some embodiments to remove any frequencies outside a narrow band in a similar way to the removal of the interferers 302 and to calculate the time delay for that narrow band. For the previous example, the process may be performed separately for a range of 2-3 GHZ, 3-4 GHZ, 4-5 GHZ, and the like, across the entire 2-10 GHz range. In this way, the time delay calibrator 102 can be configured to provide time delay calibration over frequency.

Although FIG. 3 illustrates a graph 300 depicting an example of RF noise in the frequency domain, including an interferer 302, various changes may be made to FIG. 3. For instance, the data 304 included in this example is specific to one particular calibration. However, it will be understood that the frequency domain-shaped noise data 304 in other examples can be based on different shaped gate signals 126 and can include the actual noise data that is generated while calibration is being performed.

Figure 4:
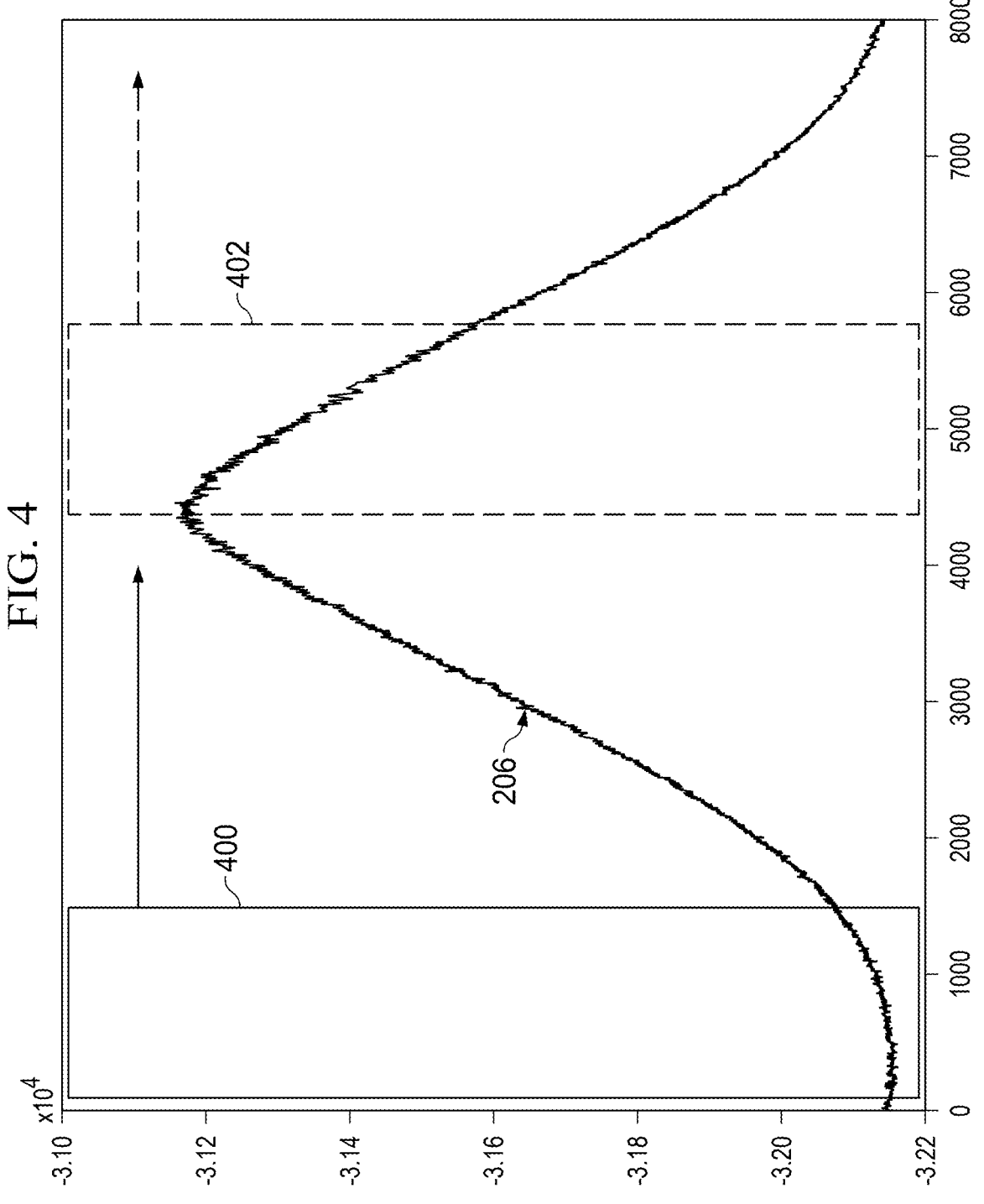
FIG. 4 illustrates an example of a time delay processing algorithm using summing windows over a gain envelope according to this disclosure.

FIG. 4 illustrates an example of a time delay processing algorithm using summing windows 400 and 402 over the gain envelope 206 according to this disclosure. The summing windows 400 and 402 shown in FIG. 4 are for illustration only. Other summing windows may be used by the time delay calibrator 102 without departing from the scope of this disclosure.

Based on the data including the gain envelope 206, the time delay calculator 124 can be configured to determine the timing of when the shaped noise data 202 reaches the ADC 116. In some cases, the time delay calculator 124 may use a threshold to determine the arrival time. However, any threshold that may be used may vary with the gains of all the amplifiers in the channels 104, possibly decreasing its accuracy. In addition, overall gain may drift over time, which can also affect accuracy. Furthermore, determining when the peak has arrived can present a challenge because the data of the gain envelope 206 is generated based on noise, so finding the peak in the noisy signal can be difficult, especially at small precise time frames.

According to other embodiments of this disclosure, the time delay calculator 124 can be configured to determine the arrival time through the use of the summing windows 400 and 402. A first summing window 400 encompasses a portion of the data in the gain envelope 206, while a second summing window 402 encompasses a different portion of the data in the gain envelope 206. For the illustrated embodiment, the first summing window 400 can encompass about 20% of the data that includes substantially the first half of the data, and the second summing window 402 can encompass about 20% of the data that includes substantially the second half of the data. In some cases, the summing windows 400 and 402 can include the same number of samples in time as each other. It will be understood that the summing windows 400 and 402 can encompass any suitable percentage of their respective portions of the data other than 20% without departing from the scope of this disclosure.

The shaped gate signal 126 injected into the gate voltages includes a low-frequency signal. For example, in some embodiments, the shaped gate signal 126 may include a 500 kHz, 2 MHz, or other suitable low-frequency signal, as opposed to an RF signal. As a result, the time delay calculator 124 can be configured to use the amplitude, instead of the phase, of the shaped gate signal 126 to determine the time delay. In some embodiments, the time delay calculator 124 can be configured to calculate the sum of the samples in each of the summing windows 400 and 402.

Figure 5:
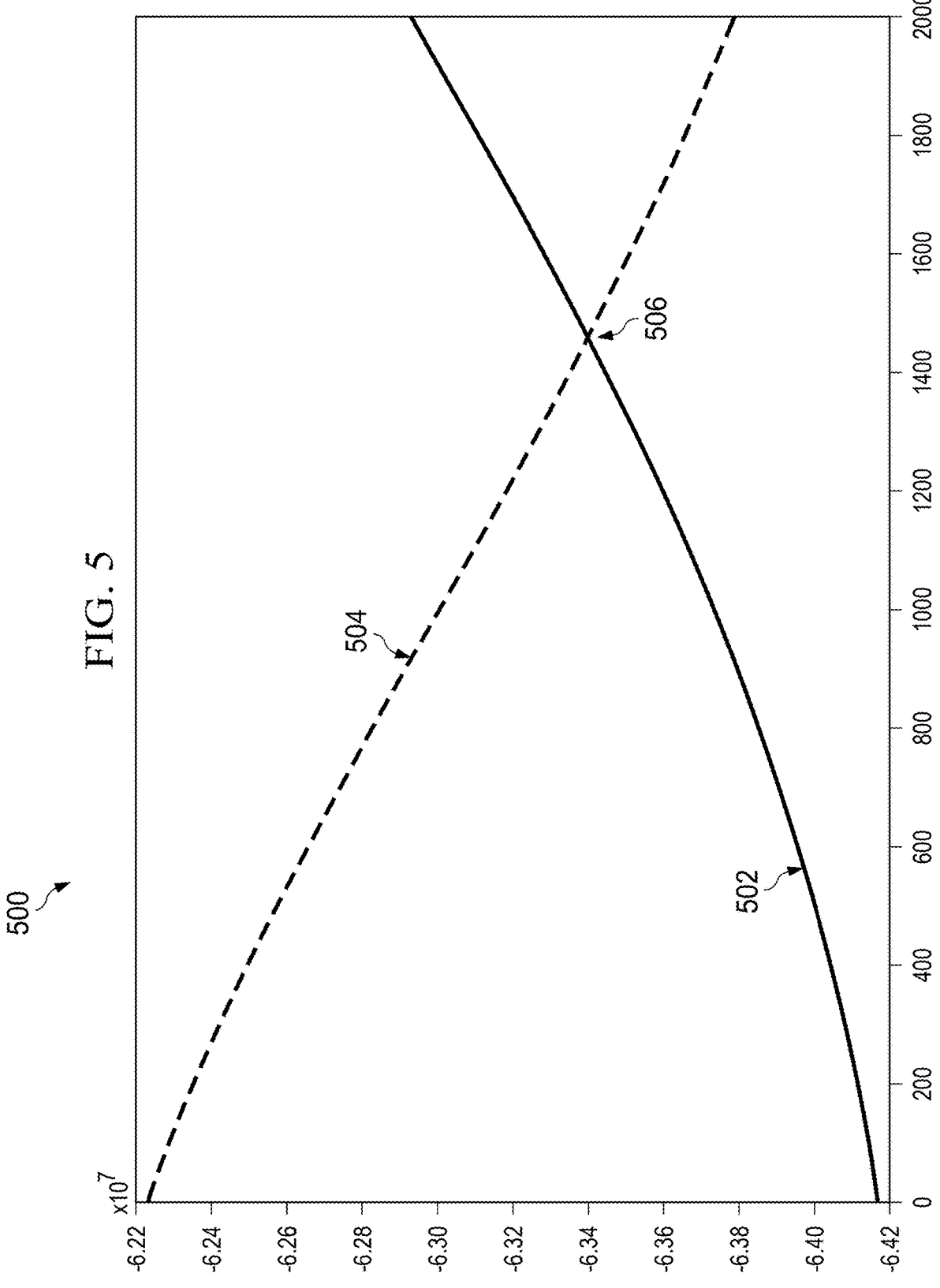
FIG. 5 illustrates a graph of an example of results calculated based on the summing windows of FIG. 4 according to this disclosure.

FIG. 5 illustrates a graph 500 of an example of results calculated based on the summing windows 400 and 402 according to this disclosure. The results shown in FIG. 5 are for illustration only. Other results may be obtained without departing from the scope of this disclosure. The summed values calculated by the time delay calculator 124 for the summing windows 400 and 402 of FIG. 4 are shown as the first data points in the graph 500, with the summed value for the first summing window 400 being graphed at the first point of the first average line 502 and the summed value for the second summing window 402 being graphed at the first point of the second average line 504.

Returning to FIG. 4, the time delay calculator 124 can be configured to shift the summing windows 400 and 402 to the right as indicated by the arrows. In some embodiments, the summing windows 400 and 402 can be moved to the right by one sample at a time such that the summing windows 400 and 402 each contain one more data point on the right and one less data point on the left, with the time delay calculator 124 summing the samples for the updated data in the current summing windows 400 and 402 as previously described. In other embodiments, the summing windows 400 and 402 can be moved to the right by any other suitable number of samples. In this way, the time delay calculator 124 can calculate a new data point to include in each of the average lines 502 and 504 in the graph 500 of FIG. 5 based on the current summing windows 400 and 402 after they have been shifted.

The time delay calculator 124 can be configured to continue shifting the summing windows 400 and 402 to the right, calculating the sums of the samples at the new location, and determining another set of data points to include in the average lines 502 and 504. Eventually, the average lines 502 and 504 will intersect each other at an intercept point 506. At this intercept point 506, the summation for the first summing window 400 has the same value as the summation for the second summing window 402 at the location corresponding to the intercept point 506. Thus, the magnitudes of the average slopes of the gain envelope 206 within the summing windows 400 and 402 are the same at this location in time. As a result, the time delay calculator 124 can be configured to determine the arrival time of the peak of the gain envelope 206 by calculating the time that is the midpoint between these two summing windows 400 and 402.

Using this technique, any gain variations in the different channels 104 wash out because an increased gain can result in a higher slope on both sides by the same factor. In addition, other variations that may cause errors may not affect the calculation because they can cause symmetric variances across the waveform. Furthermore, this technique is able to provide sub-sample resolution. For example, for embodiments in which each sample includes 62.5 ps of data and desired precision for the calculate arrival time for a particular application is less than 62.5 ps, the intercept point 506 can provide a resolution greater than 62.5 ps by interpolating between points on the average lines 502 and 504, thus allowing for the possibility of a non-integer value for that intercept point 506. In this way, sub-sample resolution can be achieved in determining when the waveform reaches the ADC 116.

Although FIG. 4 illustrates one example of a time delay processing algorithm using summing windows 400 and 402 over the gain envelope 206 and FIG. 5 illustrates a graph 500 depicting an example of results calculated based on the summing windows 400 and 402, various changes may be made to FIGS. 5 and 4. For instance, the second summing window 402 may start at a slightly different location as the time delay calculator 124 has not determined the peak of the gain envelope 206 until after performing the process of sliding the summing windows 400 and 402 to generate the average lines 502 and 504. Also, the summing windows 400 and 402 may start with the first summing window 400 near the peak of the gain envelope and the second summing window 402 near the end of the gain envelope 206. In these embodiments, the summing windows 400 and 402 would slide to the left to generate average lines similar to the average lines 502 and 504 but with the first average line starting higher and decreasing and with the second average line starting lower and increasing. In addition, it will be understood that the illustrated gain envelope 206 and corresponding average lines 502 and 504 are examples based on data specific to one particular calibration on one particular set of noise data. Also, other quantities of summation windows could be used and other operations could be performed instead of summation. For example, instead of a summation, a calculation could potentially be based on the derivative or other suitable type of calculation. For a particular example, a square wave could include three summation windows: one before the pulse, one during the pulse, and one after the pulse.

FIG. 6 illustrates an example of a method 600 for providing time delay calibration according to this disclosure. As shown in FIG. 6, a shaped gate signal 126 is injected into an active component of an RF chain at step 602. This may include, for example, the gate voltage generator 120 injecting a shaped gate signal 126 into the first LNA 108 of an RF chain for one of the channels 104 of a time delay-based array 100. As noted above, in some cases, the shaped gate signal 126 can include a triangle waveform. However, the shaped gate signal 126 can include any other suitable shape.

Based on the shaped gate signal 126, noise is amplified by the amplifiers in the RF chain to generate shaped noise data

202 at step 604. This may include, for example, the first LNA 108 amplifying the noise with different gains as the shaped gate signal 126 provides varying gate voltages to the gates of the first LNA 108 followed by the additional amplification of the noise by additional amplifiers in the RF chain. In some embodiments, the shaped noise data 202 is received at the ADC 116 of the array 100. Positive noise data 204 is generated by taking the absolute value of the shaped noise data 202 at step 606. This may include, for example, the ADC 116 providing the shaped noise data 202 to the time delay calculator 124 for processing and the time delay calculator 124 calculating the absolute value for the shaped noise data 202 received from the ADC 116.

Average values of multiple sets of positive noise data 204 are calculated to generate the gain envelope 206 at step 608. This may include, for example, the time delay calculator 124 calculating the average values of any suitable number of sets of positive noise data 204 repeatedly generated in accordance with steps 602-606. A time delay is calculated for the RF chain based on the arrival time of the shaped noise data 202 at step 610. This may include, for example, the time delay calculator 124 calculating the time at which the shaped noise data 202 arrived at the ADC 116. In some embodiments, the arrival time can be calculated in accordance with the method 800 described below in connection with FIG. 8. Also, in some embodiments, the calculated arrival time can be compared to a value determined at factory calibration to calculate the time delay based on any drift error from this factory calibration value.

The RF chain is calibrated based on the calculated time delay at step 612. This may include, for example, the time delay calculator 124 providing the calculated time delay to the time delay controller 118. This may also include the time delay controller 118 sending a time delay signal to the time delay block 110 for the RF chain based on the calculated time delay. In some embodiments, the time delay controller 118 may send a signal based on the calculated time delay regardless of the immediately previous time delay provided by the time delay block 110. In other embodiments, the time delay controller 118 may send a signal based on the calculated time delay when the calculated time delay is different from the immediately previous time delay to notify the time delay block 110 of the updated time delay. The time delay controller 118 may send no signal based on the calculated time delay when the calculated time delay is not different from the immediately previous time delay.

In this way, the time delay calibrator 102 is able to provide in-situ calibration without the limitations of traditional techniques by adjusting the gain of an RF channel over time in such a way that the time delay from an active component, such as the first LNA 108, to the ADC 116 can be measured using random noise as opposed to a signal injected into the RF chain. Since the gain of an LNA 108 varies as a function of its gate voltage, injecting a low frequency-shaped gate signal 126 on top of the gate voltage causes the noise gain of the LNA 108 to have a similar shape in the time domain. In addition, the ADC 116 can sample the noise at a particular frequency over the time period of the injected shaped gate signal 126. As a result, in-situ calibration may be provided (i) without the need for injecting a signal onto an RF path ahead of the first active component and (ii) without the additional high SWAP-C components required by that technique. In addition, receive-only arrays can implement the method 600 without the need to include hardware to create a transmit path.

Although FIG. 6 illustrates one example of a method 600 for providing time delay calibration, various changes may be made to FIG. 6. For example, while shown as a series of steps, various steps in FIG. 6 may overlap, occur in parallel, occur in a different order, or occur any number of times (including zero times). Also, in some embodiments, the method 600 can be performed for the complete range of frequencies at which the array 100 is configured to operate. However, in other embodiments, the method 600 can be performed for one or more portions of the frequency range at which the array 100 is configured to operate. For these embodiments, if variations in the time delay over frequency exist, calibration can be provided over frequency for any specified portions of the entire frequency range. As a particular example, the frequency range can be divided into 1 GHz portions, and the method 600 can be implemented separately for each portion.

Figure 7:
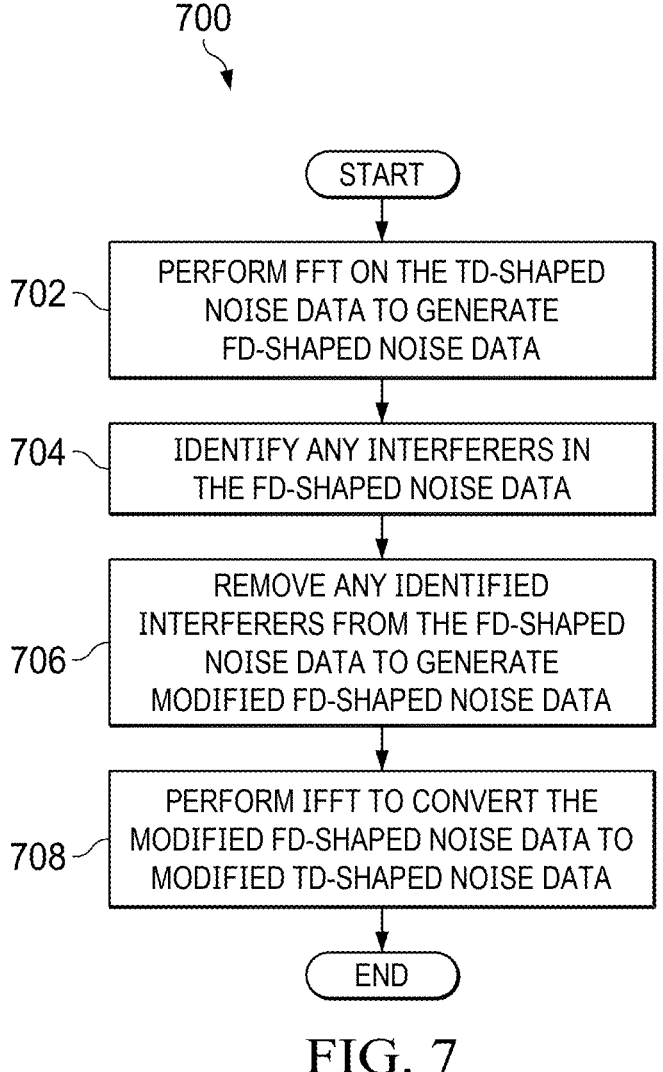
FIG. 7 illustrates an example of a method for removing interferers during time delay calibration according to this disclosure.

FIG. 7 illustrates an example of a method 700 for removing interferers during time delay calibration according to this disclosure. As shown in FIG. 7, an FFT is performed on the time domain (TD)-shaped noise data to generate frequency domain (FD)-shaped noise data 304 at step 702. This may include, for example, the time delay calculator 124 performing an FFT on the TD-shaped noise data to generate FD-shaped noise data 304.

Any interferers 302 in the FD-shaped noise data 304 are identified at step 704. This may include, for example, the time delay calculator 124 calculating an average of the values included in the FD-shaped noise data 304 and identifying any values that are a specified amount higher than the average as interferers 302. In particular embodiments, interferers 302 may be identified as any values that are 2 dB, 5 dB, or any other suitable amount higher than the average based on the specific application in which the array 100 is implemented. Any identified interferers 302 are removed from the FD-shaped noise data to generate modified FD-shaped noise data 304 at step 706. This may include, for example, the time delay calculator 124 subtracting the values that have been identified as interferers 302 from the FD-shaped noise data 304.

An inverse FFT (IFFT) is performed on the modified FD-shaped noise data to generate modified TD-shaped noise data at step 708. This may include, for example, the time delay calculator 124 performing an IFFT on the modified FD-shaped noise data to generate modified TD-shaped noise data. In this way, any interferers 302, such as cell phone base station signals, harmonics, or the like, may be removed to provide more accurate shaped noise data 202 for use in time delay calibration. For embodiments in which the method 700 is performed along with the method 600, the shaped noise data 202 generated at step 604 corresponds to the TD-shaped noise data, and the shaped noise data 202 having its absolute value taken at step 606 corresponds to the modified TD-shaped noise data.

Although FIG. 7 illustrates one example of a method 700 for removing interferers during time delay calibration, various changes may be made to FIG. 7. For example, while shown as a series of steps, various steps in FIG. 7 may overlap, occur in parallel, occur in a different order, or occur any number of times (including zero times).

Figure 8:
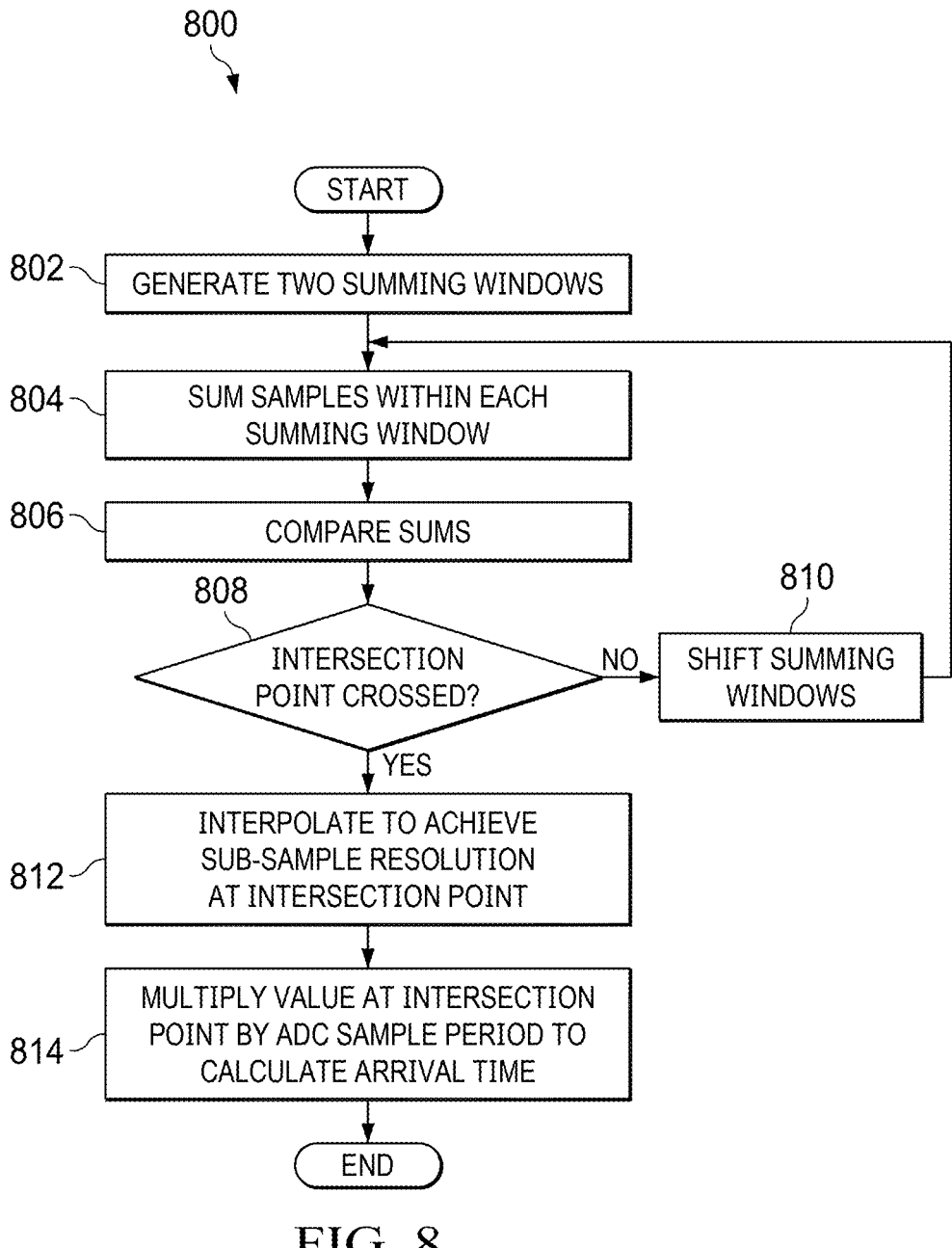
FIG. 8 illustrates an example of a method for determining an arrival time for a gain envelope during time delay calibration according to this disclosure.

FIG. 8 illustrates an example of a method 800 for determining an arrival time for the gain envelope 206 during time delay calibration according to this disclosure. As shown in FIG. 8, two summing windows 400 and 402 are generated at step 802. This may include, for example, the time delay calculator 124 generating a first summing window 400 within a portion of the first half of the gain envelope 206 and a second summing window 402 within a portion of the second half of the gain envelope 206. In some embodiments, each summing window 400 and 402 may include about 20% of the samples within the corresponding half of the gain envelope 206. In other embodiments, the summing windows 400 and 402 may include any other suitable percentage of their corresponding halves of the gain envelope 206.

The samples included in each of the summing windows 400 and 402 are summed at step 804. This may include, for example, the time delay calculator 124 summing the samples. The sums of the samples are compared to determine if an intersection point 506 has been crossed at step 806. This may include, for example, the time delay calculator 124 comparing the sums with the sum of the samples in the first summing window 400 and the sum of the samples in the second summing window 402 being compared. For example, the time delay calculator 124 may compare the data on the average lines 502 and 504 to determine whether the intersection point 506 has been crossed. When the intersection point 506 has not been crossed at step 808, the summing windows 400 and 402 are shifted at step 810, after which the method 800 returns to step 804 and the samples within the shifted summing windows 400 and 402 are summed. In some cases, this may include, for example, the time delay calculator 124 making a determination that the average lines 502 and 504 have not intersected each other. In other cases, this may include the time delay calculator 124 making a determination that the last sample has not been reached after the summing windows 400 and 402 have been shifted or otherwise determining that the intersection point 506 has been crossed.

When the intersection point 506 has been crossed at step 808, interpolation is performed to achieve sub-sample resolution at the intercept point 506 of the average lines 502 and 504 at step 812. In some cases, this may include, for example, the time delay calculator 124 making a determination that the average lines 502 and 504 have intersected each other at step 808. In other cases, this may include the time delay calculator 124 making a determination that the last sample has been reached after the summing windows 400 and 402 have been shifted to include the last sample or otherwise determining that the intersection point 506 has been crossed at step 808. This may also include the time delay calculator 124 interpolating the data included in the average lines 502 and 504 in order to determine the intercept point 506 with sub-sample resolution at step 812.

The value at the intercept point 506 is multiplied by the ADC sample period to calculate the arrival time of the shaped noise data 202 at step 814. This may include, for example, the time delay calculator 124 multiplying the value at the intercept point 506 by the ADC sample period to calculate the arrival time of the shaped noise data 202. In particular embodiments in which the ADC sample period is 62.5 ps, for example, the time delay calculator 124 can multiply the value at the intersection point by 62.5 ps to calculate the arrival time. In this way, a slope sum intercept algorithm is provided for removing variable gain impacts. As a result, the method 800 is able to provide sub-sample resolution in the calculation of the arrival time of the shaped noise data 202 at the ADC 116. For embodiments in which the method 800 is performed along with the method 600, the time delay calculated at step 610 can be based on the arrival time calculated at step 814.

Although FIG. 8 illustrates one example of a method 800 for determining an arrival time for the gain envelope 206 during time delay calibration, various changes may be made to FIG. 8. For example, while shown as a series of steps, various steps in FIG. 8 may overlap, occur in parallel, occur in a different order, or occur any number of times (including zero times).

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive (HDD), a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise", as well as derivatives thereof, mean inclusion without limitation. The term "or" is inclusive, meaning and/or. The phrase "associated with" as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of" when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A time delay calibrator comprising:
   a gate voltage generator configured to be coupled to an active component of a radio frequency (RF) chain in a time delay-based array, the gate voltage generator configured to generate a shaped gate signal and provide the shaped gate signal to a gate of the active component, the active component configured to amplify noise with a changing gain based on the shaped gate signal, the RF chain configured to generate shaped noise data based on the amplified noise; and
   a time delay calculator configured to measure a path length for the RF chain based on an arrival time for the shaped noise data and calculate a time delay for the RF chain based on the path length to calibrate the array.

2. The time delay calibrator of claim 1, further comprising:
   a clock source coupled to the gate voltage generator and to an analog-to-digital converter (ADC) for the array, the clock source configured to provide a clock signal to the gate voltage generator and the ADC to keep clocking of the gate voltage generator coherent with clocking of the ADC.

3. The time delay calibrator of claim 1, wherein the active component comprises a first active component in the RF chain.

4. The time delay calibrator of claim 1, wherein the active component comprises a low-noise amplifier (LNA).

5. The time delay calibrator of claim 1, wherein the shaped gate signal comprises one of a triangle waveform, a sawtooth waveform, or a square waveform.

6. The time delay calibrator of claim 1, wherein, to calculate the arrival time for the shaped noise data, the time delay calculator is configured:
   perform a Fast Fourier Transform (FFT) on the shaped noise data from the RF chain to generate frequency domain-shaped noise data;
   identify and remove interferers from the frequency domain-shaped noise data to generate modified frequency domain-shaped noise data; and
   perform an inverse FFT on the modified frequency domain-shaped noise data to generate modified time domain-shaped noise data for use in calculating the arrival time.

7. The time delay calibrator of claim 1, wherein the time delay calculator is configured to calculate the arrival time for the shaped noise data based on a plurality of sums of samples for a first summing window and a plurality of sums of samples for a second summing window, each sum of samples based on a different location of the corresponding summing window.

8. A time delay-based array comprising:
   a radio frequency (RF) chain comprising a plurality of active components including a specified active component;
   an analog-to-digital converter (ADC) coupled to the RF chain, the ADC configured to receive shaped noise data generated by the RF chain; and
   a time delay calibrator comprising:
      a gate voltage generator coupled to the specified active component of the RF chain, the gate voltage generator configured to generate a shaped gate signal and provide the shaped gate signal to a gate of the specified active component, the specified active component configured to amplify noise with a gain based on the shaped gate signal, the RF chain configured to generate the shaped noise data based on the amplified noise; and a time delay calculator configured to measure a path length for the RF chain based on an arrival time for the shaped noise data and calculate a time delay for the RF chain based on the path length to calibrate the array.

9. The time delay-based array of claim 8, wherein the time delay calibrator further comprises a clock source coupled to the gate voltage generator and to the ADC, the clock source configured to provide a clock signal to the gate voltage generator and the ADC to keep clocking of the gate voltage generator coherent with clocking of the ADC.

10. The time delay-based array of claim 8, wherein the specified active component comprises a first active component in the RF chain.

11. The time delay-based array of claim 8, wherein the specified active component comprises a low-noise amplifier (LNA).

12. The time delay-based array of claim 8, wherein the shaped gate signal comprises one of a triangle waveform, a sawtooth waveform, or a square waveform.

13. The time delay-based array of claim 8, wherein, to calculate the arrival time for the shaped noise data, the time delay calculator is configured to:

perform a Fast Fourier Transform (FFT) on the shaped noise data from the RF chain to generate frequency domain-shaped noise data;

identify and remove interferers from the frequency domain-shaped noise data to generate modified frequency domain-shaped noise data; and perform an inverse FFT on the modified frequency domain-shaped noise data to generate modified time domain-shaped noise data for use in calculating the arrival time.

14. The time delay-based array of claim 8, wherein the time delay calculator is configured to calculate the arrival time for the shaped noise data based on a plurality of sums of samples for a first summing window and a plurality of sums of samples for a second summing window, each sum of samples based on a different location of the corresponding summing window.

15. A method comprising:

generating a shaped gate signal using a gate voltage generator;

providing the shaped gate signal to a gate of an active component of a radio frequency (RF) chain in a time delay-based array;

amplifying noise with a changing gain based on the shaped gate signal using the active component;

generating shaped noise data based on the amplified noise using the RF chain;

measuring a path length for the RF chain based on an arrival time for the shaped noise data; and calculating a time delay for the RF chain based on the path length to calibrate the array.

16. The method of claim 15, further comprising:

providing a clock signal to the gate voltage generator and an analog-to-digital converter (ADC) for the array to keep clocking of the gate voltage generator coherent with clocking of the ADC.

17. The method of claim 15, wherein the active component comprises a low-noise amplifier (LNA).

18. The method of claim 15, wherein the shaped gate signal comprises one of a triangle waveform, a sawtooth waveform, or a square waveform.

19. The method of claim 15, wherein calculating the arrival time for the shaped noise data comprises:

performing a Fast Fourier Transform (FFT) on the shaped noise data from the RF chain to generate frequency domain-shaped noise data;

identifying and removing interferers from the frequency domain-shaped noise data to generate modified frequency domain-shaped noise data; and performing an inverse FFT on the modified frequency domain-shaped noise data to generate modified time domain-shaped noise data for use in calculating the arrival time.

20. The method of claim 15, wherein calculating the time delay for the RF chain comprises:

calculating the arrival time for the shaped noise data based on a plurality of sums of samples for a first summing window and a plurality of sums of samples for a second summing window, each sum of samples based on a different location of the corresponding summing window.

* * * * *